United States Patent
Saito et al.

(10) Patent No.: US 12,205,984 B2
(45) Date of Patent: Jan. 21, 2025

(54) SEMICONDUCTOR DEVICE WITH SURFACE AND DEEP GUARD RINGS

(71) Applicant: DENSO CORPORATION, Kariya (JP)

(72) Inventors: Jun Saito, Toyota (JP); Keita Kataoka, Nagakute (JP); Yusuke Yamashita, Nagakute (JP); Yukihiko Watanabe, Nagakute (JP); Katsuhiro Kutsuki, Nagakute (JP); Youngshin Eum, Kariya (JP)

(73) Assignee: DENSO CORPORATION, Kariya (JP)

( * ) Notice: Subject to any disclaimer, the term of this patent is extended or adjusted under 35 U.S.C. 154(b) by 414 days.

(21) Appl. No.: 17/829,791

(22) Filed: Jun. 1, 2022

(65) Prior Publication Data

US 2022/0293724 A1    Sep. 15, 2022

Related U.S. Application Data

(63) Continuation of application No. PCT/JP2019/047273, filed on Dec. 3, 2019.

(51) Int. Cl.
*H01L 29/06* (2006.01)
*H01L 29/739* (2006.01)

(52) U.S. Cl.
CPC ...... *H01L 29/0619* (2013.01); *H01L 29/0696* (2013.01); *H01L 29/7393* (2013.01)

(58) Field of Classification Search
CPC ............ H01L 29/0619; H01L 29/0696; H01L 29/7811; H01L 29/0623
USPC ....................................................... 257/288
See application file for complete search history.

(56) References Cited

U.S. PATENT DOCUMENTS

| | | | | |
|---|---|---|---|---|
| 6,426,520 B1* | 7/2002 | Traijkovic | .......... | H01L 29/0623 257/107 |
| 2002/0096715 A1* | 7/2002 | Sumida | ............... | H01L 29/7811 257/342 |
| 2015/0084124 A1* | 3/2015 | Saito | .................... | H01L 29/4236 257/330 |
| 2015/0372128 A1* | 12/2015 | Wada | .................... | H01L 29/045 257/77 |
| 2017/0365669 A1* | 12/2017 | Kim | .................... | H01L 29/0623 |
| 2019/0245043 A1 | 8/2019 | Uchida | | |

* cited by examiner

*Primary Examiner* — Nduka E Ojeh
*Assistant Examiner* — Laura M Dykes
(74) *Attorney, Agent, or Firm* — Posz Law Group, PLC

(57) ABSTRACT

A semiconductor device includes a semiconductor substrate, a top electrode in contact with a top surface of the semiconductor substrate, a bottom electrode in contact with a bottom surface of the semiconductor substrate, and an oxide film in contact with the top surface of the semiconductor substrate. The semiconductor substrate includes an element region and an outer peripheral region. The element region is a region where the top electrode is in contact with the top surface of the semiconductor substrate. The outer peripheral region is a region where the oxide film is in contact with the top surface of the semiconductor substrate, and is located between the element region and an outer peripheral end surface of the semiconductor substrate. The element region includes a semiconductor element connected between the top electrode and the bottom electrode. The outer peripheral region includes surface high-voltage-breakdown regions, deep high-voltage-breakdown regions, and a drift region.

4 Claims, 4 Drawing Sheets

SEMICONDUCTOR DEVICE WITH SURFACE AND DEEP GUARD RINGS

CROSS REFERENCE TO RELATED APPLICATION

The present application is a continuation application of International Patent Application No. PCT/JP2019/047273 filed on Dec. 3, 2019, which designated the U.S. The entire disclosure of the above application is incorporated herein by reference.

TECHNICAL FIELD

The present disclosure relates to a semiconductor device.

BACKGROUND

A semiconductor device may include multiple guard rings at an outer peripheral region of a semiconductor substrate.

SUMMARY

The present disclosure describes a semiconductor device including a semiconductor substrate, a top electrode, a bottom electrode, and an oxide film.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
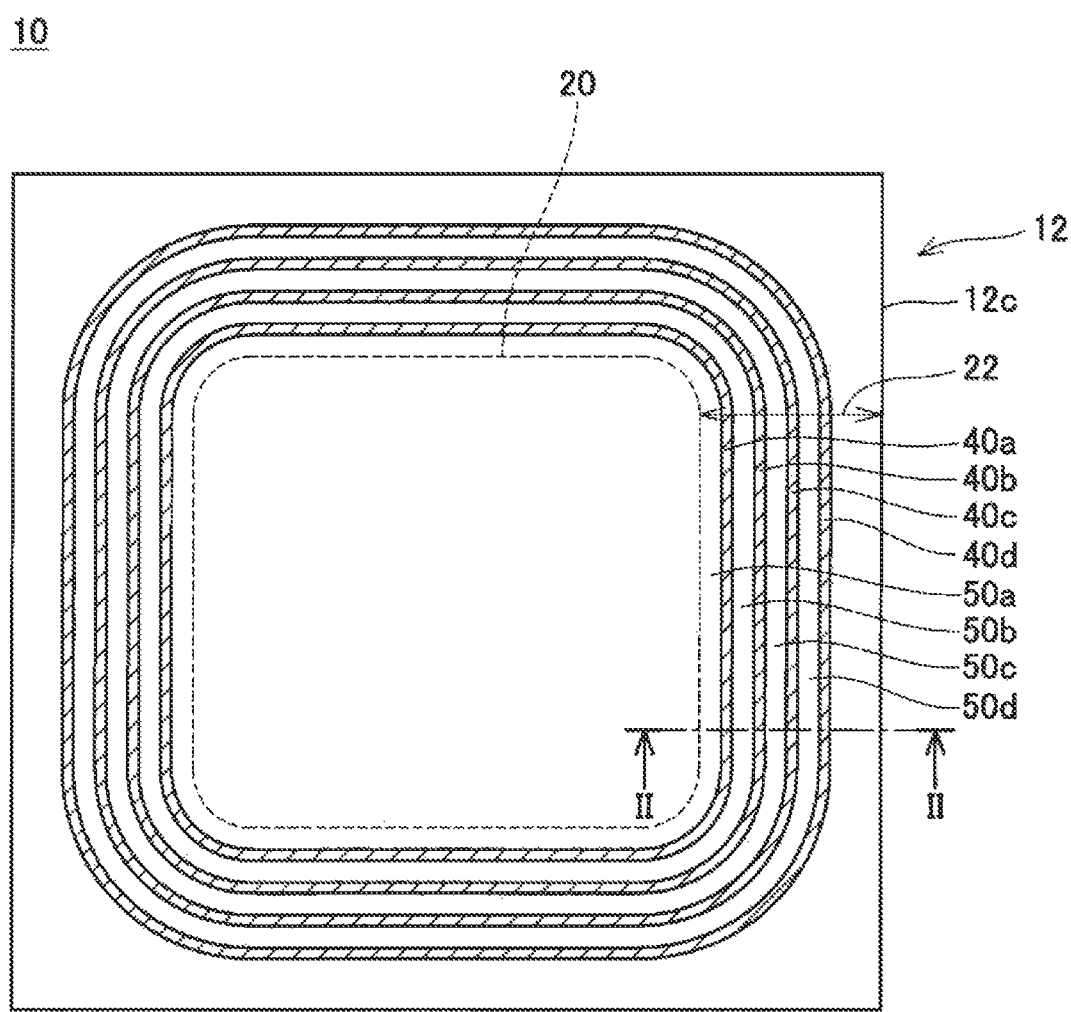
FIG. 1 is a top view of a semiconductor device.

In a semiconductor device, guard rings may be provided at an outer peripheral region of a semiconductor substrate. The outer peripheral region of the semiconductor substrate may be covered with a protection film. An oxide film may be adopted as the protection film. The guard rings may be in contact with the protection film. The guard rings may be arranged to be spaced from each other from an inner peripheral side closer to an element region to an outer peripheral side closer to an outer peripheral end surface of the semiconductor substrate. When the semiconductor device is turned off, a depletion layer extends at a drift region located in the outer peripheral region. When the depletion layer extends at the drift region located in the outer peripheral region, the electrical field concentration in the outer peripheral region may be relieved by the guard rings. Therefore, it is possible to enhance the withstand voltage of the semiconductor device. In the following, a p-type region provided inside the outer peripheral region such as the guard ring may also be referred to as a high-voltage-breakdown region that corresponds to a voltage-withstand region.

If the spacing between adjacent two high-voltage-breakdown regions is made to be wider, a relatively high electrical field may occur between the spacing when the drift region is depleted at the spacing between the adjacent two voltage-withstand regions. When the relatively high electrical field is generated at the spacing between the adjacent two voltage-withstand regions, hot carriers accelerated by the electrical field are injected into the oxide film that covers the outer peripheral region. As a result, the electrical field distribution in the outer peripheral region may be disturbed, and the withstand voltage of the semiconductor device may be lowered. It is possible to reduce the electrical field generated at the spacing between the adjacent two voltage-withstand regions by narrowing the spacing between the adjacent two voltage-withstand regions. However, there may be a limit to narrow the spacing between the adjacent two voltage-withstand regions due to manufacturing precision.

According to an aspect of the present disclosure, a semiconductor device includes a semiconductor substrate, a top electrode in contact with a top surface of the semiconductor substrate, a bottom electrode in contact with a bottom surface of the semiconductor substrate, and an oxide film in contact with the top surface of the semiconductor substrate. The semiconductor substrate includes an element region and an outer peripheral region. The element region is a region where the top electrode is in contact with the top surface of the semiconductor substrate. The outer peripheral region is a region where the oxide film is in contact with the top surface of the semiconductor substrate, and is located between the element region and an outer peripheral end surface of the semiconductor substrate. The element region includes a semiconductor element connected between the top electrode and the bottom electrode. The outer peripheral region includes surface high-voltage-breakdown regions, deep high-voltage-breakdown regions, and a drift region. Each of the surface high-voltage-breakdown regions has p-type conductivity. Each of the deep high-voltage-breakdown regions has the p-type conductivity. The drift region has n-type conductivity. Each of the surface high-voltage-breakdown regions is in contact with the oxide film. The surface high-voltage-breakdown regions are disposed to be spaced from each other along a direction from an inner peripheral side of the semiconductor substrate to an outer peripheral side of the semiconductor substrate. The deep high-voltage-breakdown regions are respectively disposed at respective positions closer to a bottom surface of the semiconductor substrate than the surface high-voltage-breakdown regions. The deep high-voltage-breakdown regions are disposed to be spaced from each other along the direction from the inner peripheral side to the outer peripheral side. The drift region separates the surface high-voltage-breakdown regions from the deep high-voltage-breakdown regions, separates the surface high-voltage-breakdown regions, and separates the deep high-voltage-breakdown regions. The drift region located at spacing between adjacent two of the surface high-voltage-breakdown regions is defined as a surface spacing region, and the drift region located at spacing between two of the deep high-voltage-breakdown regions is defined as a deep spacing region. The adjacent two of deep high-voltage-breakdown regions are located right under the surface spacing region, and the deep spacing region is located right under the adjacent two of the surface high-voltage-breakdown regions. Each of the deep high-voltage-breakdown regions extends from a first position to a second position. The first position is right under a corresponding one of the surface high-voltage-breakdown regions that is adjacent to the each of the deep high-voltage-breakdown regions and closer to the inner peripheral side than the each of the deep high-voltage-breakdown regions. The second position is right under another corresponding one of the surface high-voltage-breakdown regions that is adjacent to the each of the deep high-voltage-breakdown regions and closer to the outer peripheral side than the each of the deep high-voltage-breakdown regions. One of the deep high-voltage-breakdown regions is defined as a specific deep high-voltage-breakdown region. One of the surface high-voltage-breakdown regions that is adjacent to the specific deep high-voltage-breakdown region and closer to the inner peripheral side than the specific deep high-voltage-breakdown region is defined as an inner peripheral surface high-voltage-breakdown region. Another one of the surface high-voltage-breakdown regions that is adjacent to the specific deep high-voltage-breakdown region and closer to the outer peripheral side than the specific deep high-voltage-breakdown region is defined as an outer peripheral surface high-voltage-breakdown region. The semiconductor substrate is made to satisfy the following mathematical relation (1):

$$Nv \times (Wv1+Wv2)^2 < Ns \times Ws^2 \qquad (1)$$

where Ws is in a unit of meters and denotes a width of spacing between the inner peripheral surface high-voltage-breakdown region and the outer peripheral surface high-voltage-breakdown region, Ns is in a unit of inverse cubic meters and denotes n-type impurity concentration of the surface spacing region between the inner peripheral surface high-voltage-breakdown region and the outer peripheral surface high-voltage-breakdown region, Nv is in the unit of inverse cubic meters and denotes n-type impurity concentration of the drift region located in a depth region between each of the surface high-voltage-breakdown regions and corresponding one of the deep high-voltage-breakdown regions, Wv1 is in the unit of meters and denotes a width of spacing between the inner peripheral surface high-voltage-breakdown region and the specific deep high-voltage-breakdown region, and Wv2 is in the unit of meters and denotes a width of spacing between the outer peripheral surface high-voltage-breakdown region and the specific deep high-voltage-breakdown region. The above mathematical relation (1) corresponds to the mathematical relation (2) described hereinafter.

In the present disclosure, the phrase "inner peripheral side" may also be referred to a direction or a location closer to an element region than the outer peripheral end surface of the semiconductor substrate, and the phrase "outer peripheral side" may also be referred to as a direction or a location closer to the outer peripheral end surface of the semiconductor substrate than the element region. In the present disclosure, the phrase "adjacent to . . . and closer to the inner peripheral side" may be referred to a region located adjacent to a target region and located closer to the inner peripheral side. For example, the phrase "the surface high-voltage-breakdown region located adjacent to a specific deep high-voltage-breakdown region and closer to the inner peripheral side" may be referred to as one of the surface high-voltage-breakdown region(s) located closest to the specific deep high-voltage-breakdown region and located closer to the inner peripheral side than the specific deep high-voltage-breakdown region. In the present disclosure, the phrase "adjacent to . . . and closer to the outer peripheral side" may also be referred to as a region located closest to a target region and closer to the outer peripheral side than the target region. For example, the phrase "the surface high-voltage-breakdown region adjacent to the specific deep high-voltage-breakdown region and closer to the outer peripheral side" may also be referred to as one of the surface high-voltage-breakdown region(s) located closest to the specific deep high-voltage-breakdown region and closer to the outer peripheral side than the specific deep high-voltage-breakdown region.

In the semiconductor device, when the depletion layer widens into the drift region that is provided in the outer peripheral region from the element region, the depletion layer extends through the surface high-voltage-breakdown region and the deep high-voltage-breakdown region. When the depletion layer reaches the inner peripheral surface high-voltage-breakdown region, the depletion layer widens from the inner peripheral surface high-voltage-breakdown region to its surrounding. When the above mathematical relation is satisfied, the depletion layer widened from the inner peripheral surface high-voltage-breakdown region reaches the outer peripheral surface high-voltage-breakdown region through the specific deep high-voltage-breakdown region, before the depletion layer widened from the inner peripheral surface high-voltage-breakdown region directly reaches the outer peripheral surface high-voltage-breakdown region. Therefore, the potential of the specific deep high-voltage-breakdown region is higher than the inner peripheral surface high-voltage-breakdown region, and is lower than the outer peripheral surface high-voltage-breakdown region. When the potential is distributed as described above, the electrical field is dispersed in the surface spacing region between the inner peripheral surface high-voltage-breakdown region and the outer peripheral surface high-voltage-breakdown region. The surface spacing region is the drift region in the vicinity of the oxide film. According to this semiconductor device, it is possible to suppress the injection of hot carriers into the oxide film.

The additional features of a method for forming a film disclosed herein are listed below. Each feature listed below is useful independently.

In the semiconductor device according to one or more of the following embodiments, the width Wv1 may be smaller than the width Ws, and the width Wv2 may be smaller than the width Ws.

According to the above structure, it is possible to satisfy the above mathematical relation (1) while ensuring a relatively large width Ws of the spacing between the inner peripheral surface high-voltage-breakdown region and the outer peripheral surface high-voltage-breakdown region. Since the width Ws of the spacing between the inner peripheral surface high-voltage-breakdown region and the outer peripheral surface high-voltage-breakdown region is along a lateral direction, in other words, a direction along the top surface of the semiconductor substrate, there may be a limit in narrowing the width Ws due to the manufacturing precision. The width Wv1 of the spacing between the specific deep high-voltage-breakdown region and the inner peripheral surface high-voltage-breakdown region and the width Wv2 of the spacing between the specific deep high-voltage-breakdown region and the outer peripheral surface high-voltage-breakdown region are along a vertical direction, in other words, the thickness direction of the semiconductor substrate. Therefore, it is easier to narrow the widths Wv1, Wv2 through the control of the thickness of an epitaxial film or the control of the depth of ion implantation. According to this structure, it is possible to easily satisfy the above mathematical relation (1).

In the semiconductor device according to one or more of the following embodiments, the n-type impurity concentration of each of the deep spacing regions may be higher than the n-type impurity concentration of each of the surface spacing regions.

According to this structure, a relatively high electrical field is easily generated at the deep spacing region, and the relatively high electrical field is hardly generated at the surface spacing region. For this reason, the hot carriers are hardly to be generated at the surface spacing region, and the injection of the hot carriers into the oxide film is suppressed.

In the semiconductor device according to one or more of the following embodiments, the semiconductor substrate is made to satisfy the mathematical relation of $Nd \times Wd^2 > Ns \times Ws^2$, where Wd is in the unit of meters (m) and denotes the width of the spacing between any adjacent two of the deep high-voltage-breakdown regions, and Nd is in the unit of inverse cubic meters $(m^{-3})$ and denotes the n-type impurity concentration of each of the deep spacing regions.

In this structure, a relatively high electrical field is easily generated at the deep spacing region, and the relatively high electrical field is hardly generated at the surface spacing region. For this reason, hot carriers are hardly to be generated at the surface spacing region, and the injection of the hot carriers into the oxide film is suppressed.

First Embodiment

Figure 2:
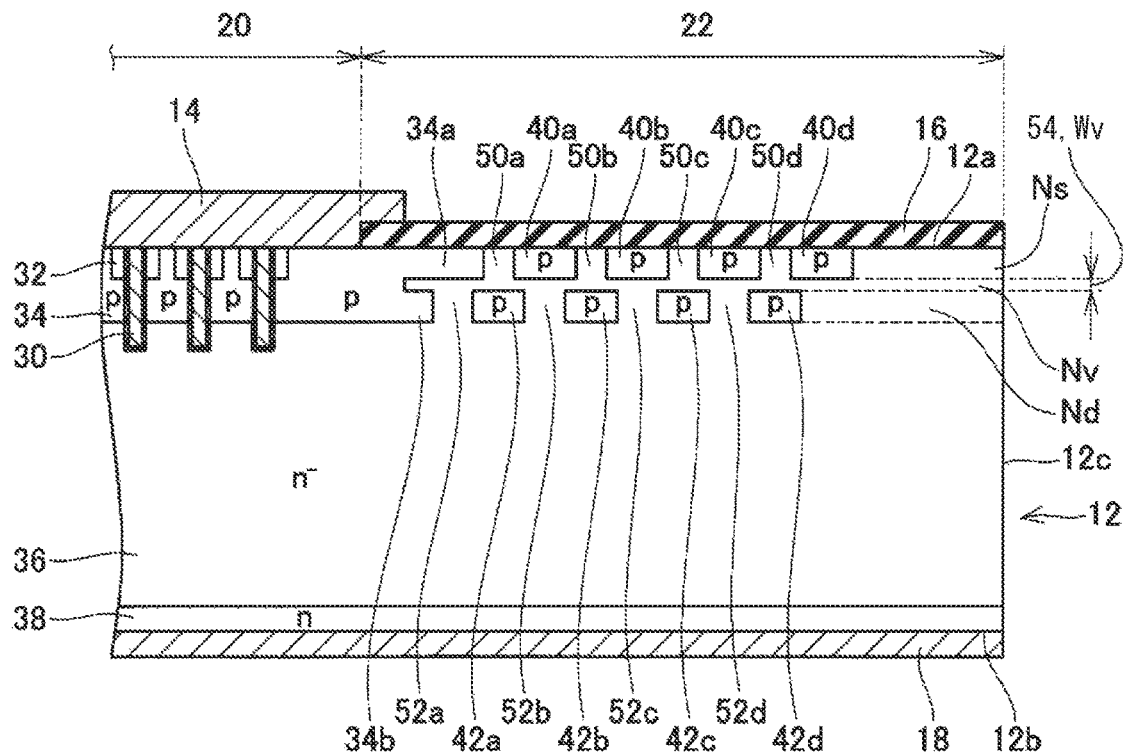
FIG. 2 is a cross-sectional view of the semiconductor device taken along line II-II in FIG. 1.

FIGS. 1, 2 respectively illustrate the semiconductor device 10 according to a first embodiment. As illustrated in FIGS. 1, 2, the semiconductor device 10 includes a semiconductor substrate 12. As illustrated in FIG. 2, a top electrode 14 and an oxide film 16 are arranged at a top surface 12a of the semiconductor substrate 12. The oxide film 16 is an insulating protection film made of silicon oxide. FIG. 1 omits the illustration of the top electrode 14 and the oxide film 16. The semiconductor substrate 12 includes an element region 20 and an outer peripheral region 22. The element region 20 is a region where the top electrode 14 is in contact with the top surface 12a of the semiconductor substrate 12. The outer peripheral region 22 is a region where the oxide film 16 is in contact with the top surface 12a of the semiconductor substrate 12. As illustrated in FIG. 1, the element region 20 is provided at a central portion of the semiconductor substrate 12. The outer peripheral region 22 is provided between the element region 20 and an outer peripheral end surface 12c of the semiconductor substrate 12. The outer peripheral region 22 surrounds the element region 20. A bottom electrode 18 is provided at a bottom surface 12b of the semiconductor substrate 12. The bottom electrode 18 is in contact with substantially the entire region of the bottom surface 12b.

A Metal-Oxide-Semiconductor Field-Effect Transistor (MOSFET) is formed at the element region 20. As illustrated in FIG. 2, the MOSFET includes a gate electrode 30, a source region 32, a body region 34, a drift region 36, and a drain region 38. One or more trenches are disposed at the top surface 12a inside the element region 20, and the gate electrode 30 is arranged inside each of the trenches. The gate electrode 30 is insulated from the semiconductor substrate 12 through a gate insulation film. The source region 32 is an n-type region, and is in contact with the top electrode 14 and the gate insulation film. The body region 34 is a p-type region, and is in contact with the top electrode 14. The body region 34 is in contact with the gate insulating film at the bottom side of the source region 32. In other words, the body region 34 is in contact with the gate insulating film at a position closer to the bottom surface of the semiconductor substrate than the source region 32. The body region 34 includes a surface protruding portion 34a that protrudes towards the outer peripheral side of the body region 34 covering a region including the top surface 12a of the semiconductor substrate 12. The surface protruding portion 34a is arranged inside the outer peripheral region 22. The body region 34 includes a deep protruding portion 34b that protrudes towards the outer peripheral side of the body region 34 and is located at the bottom side of the surface protruding portion 34a. In other words, the deep protruding portion 34b is located near the bottom surface of the surface protruding portion 34a. The deep protruding portion 34b is arranged inside the outer peripheral region 22. The protruding amount of the deep protruding portion 34b is less than the protruding amount of the surface protruding portion 34a. The drift region 36 is the n-type region with relatively low concentration and is arranged at the bottom side of the body region 34. In other words, the drift region 36 is arranged at a position closer to the bottom surface of the semiconductor substrate 12 than the body region 34. The drift region 36 is in contact with the gate insulating film at the bottom side of the body region 34. The drain region 38 is the n-type region with relatively high concentration, and is located at the bottom side of the drift region 36. In other words, the drain region 38 is located at a position closer to the bottom surface of the semiconductor substrate 12 than the drift region 36. The drain region 38 is in contact with the bottom electrode 18.

The drift region 36 and the drain region 38 are distributed in a direction from the element region 20 to the outer peripheral region 22. The drift region 36 and the drain region 38 are exposed at the outer peripheral end surface 12c of the semiconductor substrate 12.

Multiple surface guard rings 40a to 40d and multiple deep guard rings 42a to 42d are provided at the outer peripheral region 22.

The surface guard rings 40a to 40d are p-type regions, and are arranged at a region exposed at the top surface 12a of the semiconductor substrate 12. Each of the surface guard rings 40a to 40d is in contact with the oxide film 16. As illustrated in FIG. 1, the surface guard rings 40a to 40d respectively extend in ring shapes to surround the element region 20 in a multilayered form. As illustrated in FIG. 2, the surface guard rings 40a to 40d are respectively arranged to be spaced from each other in a direction from the inner peripheral side to the outer peripheral side. The drift region 36 is distributed at each spacing between corresponding adjacent two of the surface guard rings 40a to 40d. The drift region 36 is exposed at the top surface 12a of the semiconductor substrate 12 at the spacing. The surface guard rings 40a to 40d are separated from each other by the drift region 36.

A gap is provided between the surface guard ring 40a at the innermost peripheral side and the surface protruding portion 34a of the body region 34. The drift region 36 is distributed at the spacing. The drift region 36 is exposed at the top surface 12a of the semiconductor substrate 12 at the spacing. The surface guard rings 40a to 40d are separated from the body region 34 by the drift region 36. In the following, a portion of the drift region 36 located at the spacing between the surface guard ring 40a and the surface protruding portion 34a is referred to as a surface spacing region 50a. In the following, a portion of the drift region 36 located the spacing between the surface guard ring 40a and the surface guard ring 40b is referred to as a surface spacing region 50b, a portion of the drift region 36 located at the spacing between the surface guard ring 40b and the surface guard ring 40c is referred to as a surface spacing region 50c; and a portion of the drift region 36 located at the spacing between the surface guard ring 40c and the surface guard ring 40d is referred to as a surface spacing region 50d.

The deep guard rings 42a to 42d are p-type regions, and are respectively arranged at the bottom side of the respective surface guard rings 40a to 40d, that is, positions deeper than the surface guard rings 40a to 40d in the thickness direction of the semiconductor substrate 12. In other words, the deep guard rings 42a to 42d are arranged at the bottom side of the respective bottom ends of the surface guard rings 40a to 40d. The deep guard rings 42a to 42d are provided at substantially the same depth as the deep protruding portion 34b of the body region 34. The drift region 36 is distributed at a region between each corresponding one of the bottom ends of the surface guard rings 40a to 40d and each corresponding one of the top ends of the deep guard rings 42a to 42d. In the following, the drift region 36 located between each corresponding one of the bottom ends of the surface guard rings 40a to 40d and each of the top ends of the deep guard rings 42a to 42d is referred to as an intermediate region 54. The deep guard rings 42a to 42d are separated from the surface guard rings 40a to 40d through the intermediate region 54 included in the drift region 36. The deep guard rings 42a to 42d are arranged to be spaced out in a direction from the inner peripheral side to the outer peripheral side. The deep guard rings 42a to 42d are respectively arranged right under the surface spacing regions 50a to 50d. When the semiconductor substrate 12 is viewed in a plan view from above, the deep guard ring 42a is arranged at a position overlapping with the surface spacing region 50a; the deep guard ring 42b is arranged at a position overlapping with the surface spacing region 50b, the deep guard ring 42c is arranged at a portion overlapping with the surface spacing region 50c; and the deep guard ring 42d is arranged at a position overlapping with the surface spacing region 50d. The deep guard rings 42a to 42d respectively extend in ring shapes to surround the element region 20 in a multilayered form along the surface spacing region 50a to 50d respectively extending in ring shapes as shown in FIG. 1.

As illustrated in FIG. 2, spacing is provided between the deep guard ring 42a at the innermost peripheral side and the deep protruding portion 34b of the body region 34. The drift region 36 is distributed in the spacing. The deep guard rings 42a to 42d are separated from the body region 34 by the drift region 36. In the following, a portion of the drift region 36 located at the spacing between the deep guard ring 42a and the deep protruding portion 34b is referred to as a deep spacing region 52a. The drift region 36 is distributed in the spacing between corresponding adjacent two of the deep guard rings 42a to 42d. The deep guard rings 42a to 42d are separated from each other by the drift region 36. In the following, a portion of the drift region 36 located the spacing between the deep guard ring 42a and the deep guard ring 42b is referred to as a deep spacing region 52b; a portion of the drift region 36 located at the spacing between the deep guard ring 42b and the deep guard ring 42c is referred to as a deep spacing region 52c; and a portion of the drift region 36 located at the spacing between the deep guard ring 42c and the deep guard ring 42d is referred to as a deep spacing region 52d. The deep spacing region 52a is arranged right under the surface protruding portion 34a. The deep spacing regions 52b to 52d are respectively arranged right under the surface guard rings 40a to 40c. When the semiconductor substrate 12 is viewed in a plan view from above, the deep spacing region 52a is arranged at a position overlapping with the surface protruding portion 34a; the deep spacing region 52b is arranged at a position overlapping with the surface guard ring 40a; the deep spacing region 52c is arranged at a portion overlapping with the surface guard ring 40b; and the deep spacing region 52d is arranged at a position overlapping with the surface guard ring 40c.

In the following, the surface protruding portion 34a of the body region 34 and the surface guard rings 40a to 40d correspond to surface voltage-withstand regions or surface high-voltage-breakdown regions. In the following, the deep protruding portion 34b of the body region 34 and the deep guard rings 42a to 42d correspond to deep voltage-withstand regions or deep high-voltage-breakdown regions.

In the following, the surface high-voltage-breakdown region located adjacent to a target deep guard ring as an arbitrary one of the deep guard rings 42a to 42d and closer to the inner peripheral side than the outer peripheral side is referred to an inner peripheral surface high-voltage-breakdown region; and the surface high-voltage-breakdown region located adjacent to another target deep guard ring and closer to the outer peripheral side than the inner peripheral side is referred to as an outer peripheral surface high-voltage-breakdown region. For example, the surface protruding portion 34a located adjacent to the deep guard ring 42a is an inner peripheral surface high-voltage-breakdown region, and the surface guard ring 40a adjacent to the deep guard ring 42a is the outer peripheral surface high-voltage-breakdown region. Additionally, for example, the surface guard ring 40a located adjacent to the deep guard ring 42b is an inner peripheral surface high-voltage-breakdown region, and the surface guard ring 40b adjacent to the deep guard ring 42a is the outer peripheral surface high-voltage-breakdown region.

Each of the deep guard rings 42a to 42d extends from a position right under the inner peripheral surface high-voltage-breakdown region to a position right under the outer peripheral surface high-voltage-breakdown region. For example, the deep guard ring 42a extends from a position right under the surface protruding portion 34a to a position right under the surface guard ring 40a. In other words, the end portion of the deep guard ring 42a closer to the inner peripheral side is located right under the surface protruding portion 34a, and the end portion of the deep guard ring 42a closer to the outer peripheral side is located right under the surface guard ring 40a. Additionally, for example, the deep guard ring 42b extends from a position right under the surface guard ring 40a to a position right under the surface guard ring 40b. In other words, the end portion of the deep guard ring 42b closer to the inner peripheral side is located right under the surface guard ring 40a, and the end portion of the deep guard ring 42b closer to the outer peripheral side is located right under the surface guard ring 40b.

In FIG. 2, the symbol Nv in a unit of inverse cubic meters ($m^{-3}$) indicates the concentration of n-type impurities in the intermediate region 54. Further, the symbol Ns in the unit of inverse cubic meters ($m^{-3}$) indicates the concentration of n-type impurities in the drift region 36 at the top side of the intermediate region 54. The symbol Ns indicates the concentration of n-type impurities inside each of the surface spacing regions 50a to 50d. The symbol Nd in the unit of inverse cubic meters ($m^{-3}$) indicates the concentration of n-type impurities inside the drift region 36 at the bottom side of the intermediate region 54 closer to the bottom surface of the semiconductor substrate 12. The symbol Nd in the unit of inverse cubic meters ($m^{-3}$) indicates the concentration of n-type impurities inside each of the deep spacing regions 52a to 52d. In the first embodiment, the concentration of n-type impurities is constant in the entire drift region. In other words, in the first embodiment, a mathematical relation of Ns=Nv=Nd is satisfied.

Each of the deep guard rings 42a to 42d is arranged to satisfy the following mathematical relation (2).

$$Nv \times (Wv1+Wv2)^2 < Ns \times Ws^2 \quad (2)$$

In the mathematical relation (2), the symbol Wv1 in a unit of meters (m) denotes the width of the spacing between the target deep guard ring and the inner peripheral surface high-voltage-breakdown region. The symbol Wv2 in the unit of meters (m) denotes the width of the spacing between the target deep guard ring and the outer peripheral surface high-voltage-breakdown region. The symbol Ws in the unit of meters (m) denotes the width of target guard ring at the spacing between the inner peripheral surface high-voltage-breakdown region and the outer peripheral surface high-voltage-breakdown region. The widths Wv1 and Wv2 are dimensions in the thickness direction of the semiconductor substrate 12, and the width Ws is the dimension along a lateral direction of the semiconductor substrate 12. The lateral direction corresponds to the direction from the inner peripheral side of the semiconductor substrate 12 to the outer peripheral side of the semiconductor substrate 12.

Figure 3:
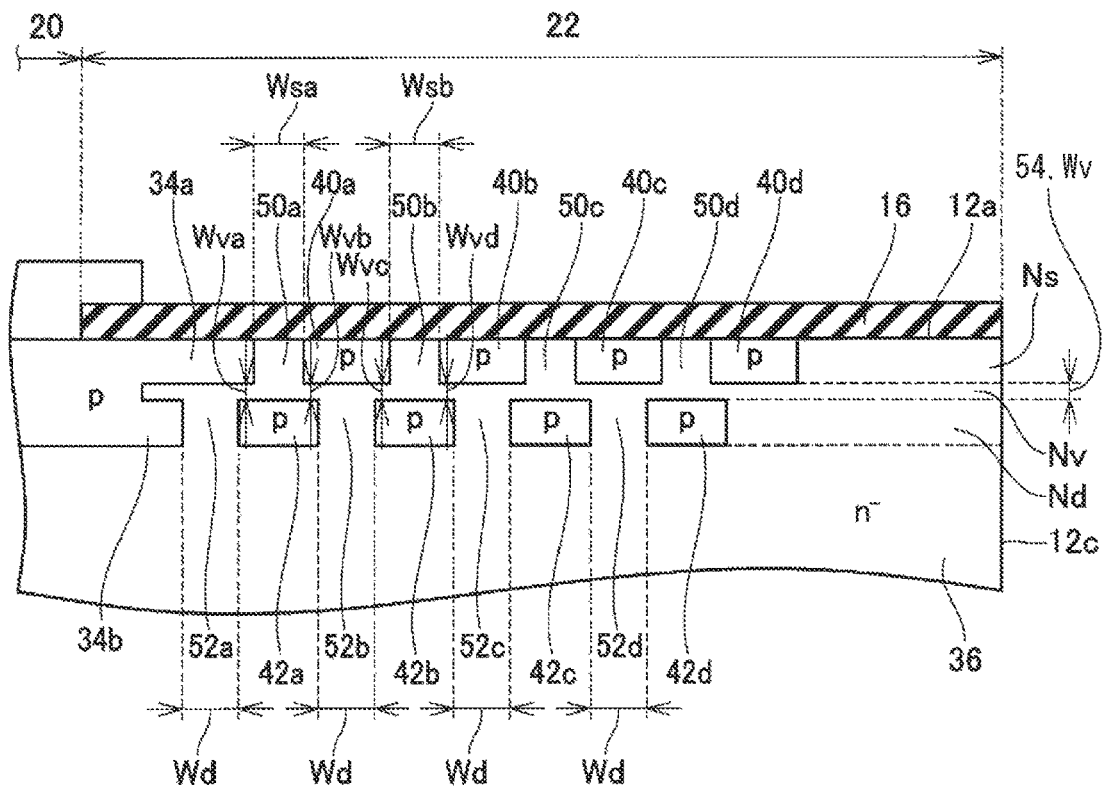
FIG. 3 is an enlarged cross-sectional view of an outer peripheral region of the semiconductor device.

For example, when the target deep guard ring refers to the deep guard ring 42a, the width Wv1 is the width of the spacing between the deep guard ring 42a and the surface protruding portion 34a (in other words, the width Wva in FIG. 3), the width Wv2 is the width of the spacing between the deep guard ring 42a and the surface guard ring 40a (in other words, the width Wvb in FIG. 3), and the width Ws is the width of the spacing between the surface protruding portion 34a and the surface guard ring 40a (in other words, the width Wsa in FIG. 3). For example, when the target deep guard ring refers to the deep guard ring 42b, the width Wv1 is the width of the spacing between the deep guard ring 42b and the surface guard ring 40a (in other words, the width Wvc in FIG. 3), the width Wv2 is the width of the spacing between the deep guard ring 42b and the surface guard ring 40b (in other words, the width Wvd in FIG. 3), and the width Ws is the width of the spacing between the surface guard ring 40a and the surface guard ring 40b (in other words, the width Wsb in FIG. 3).

As described above, in the first embodiment, the concentration of n-type impurities in the entire drift region 36 is constant. In other words, the mathematical relation of Nv=Ns is satisfied. In the first embodiment, the width Wv1 and the width Wv2 are equal to the thickness Wv of the intermediate region 54. In the first embodiment, the mathematical relation (2) corresponds to the following mathematical relation (3).

$$2Wv < Ws \quad (3)$$

Each of the deep guard rings 42a to 42d is arranged to satisfy the mathematical relation (3).

Further, the width Wd shown in FIG. 3 indicates the width of the spacing between adjacent two of the deep high-voltage-breakdown regions, that is, the width between corresponding adjacent two of the deep spacing regions 52a to 52d). In the first embodiment, each of the surface guard rings 40a to 40d and each of the deep guard rings 42a to 42d are arranged to satisfy the following mathematical relation (4).

$$Nd \times Wd^2 > Ns \times Ws^2 \quad (4)$$

As described above, in the first embodiment, the concentration of n-type impurities in the entire drift region 36 is constant. In other words, the mathematical relation of Nd=Ns is satisfied. In the first embodiment, the mathematical relation (4) corresponds to the following mathematical relation (5).

$$Wd > Ws \quad (5)$$

In the first embodiment, the width Wd is larger than the width Ws such as each of the widths Wsa, Wsb in FIG. 3.

The following describes that the depletion layer progresses inside the outer peripheral region 22 when the MOSFET inside the element region 20 is turned off. When the MOSFET is turned off, the potential of the bottom electrode 18 becomes higher than the potential of the top electrode 14. Then, the depletion layer extends from the body region 34 into the drift region 36. In the outer peripheral region 22, the depletion layer extends from the surface protruding portion 34a of the body region 34 to its surrounding. Since the width Wva of the spacing between the surface protruding portion 34a and the deep guard ring 42a is narrower than the width of the surface spacing region 50a, the depletion layer extending from the surface protruding portion 34a reaches the deep guard ring 42a, before the depletion layer reaches the surface guard ring 40a. Then, the depletion layer spreads from the deep guard ring 42a to the drift region 36 around the deep guard ring 42a. Since the deep guard ring 42 satisfies the mathematical relations (2) and (3), the depletion layer extending from the deep guard ring 42a reaches the surface guard ring 40a before the depletion layer extending from the surface protruding portion 34a reaches the deep guard ring 42a. As described above, the depletion layer extending from the surface protruding portion 34a reaches the surface guard ring 40a through the deep guard ring 42a, before the depletion layer directly reaches the surface guard ring 40a. When the depletion layer reaches the surface guard ring 40a, the depletion layer extends from the surface guard ring 40a around the depletion layer. Since the deep guard ring 42 satisfies the mathematical relations (2) and (3), the depletion layer reaches the surface guard ring 40a before the depletion layer extending from the surface protruding portion 34a reaches the deep guard ring 42a. As described above, the depletion layer extending from the surface protruding portion 34a reaches the surface guard ring 40a through the deep guard ring 42a, before the depletion layer directly reaches the surface guard ring 40a. Similarly, the depletion layer extending from the surface protruding portion 34a reaches the surface guard ring 40d through the deep guard ring 42d, before the depletion layer directly reaches the surface guard ring 40d. The depletion layer extending from the surface protruding portion 34a spreads to the outer peripheral side through each of the guard rings in a sequential order of the guard rings 42a, 40a, 42b, 40b, 42c, 40c, 42d, and 40d. Therefore, when the depletion layer sufficiently extends to the outer peripheral region 22, the potential of the guard ring 42a is the lowest, and the potential gradually increases from the guard rings 42a, 40a, 42b, 40b, 42c, 40c, 42d, and 40d in this sequential order.

Figure 4:
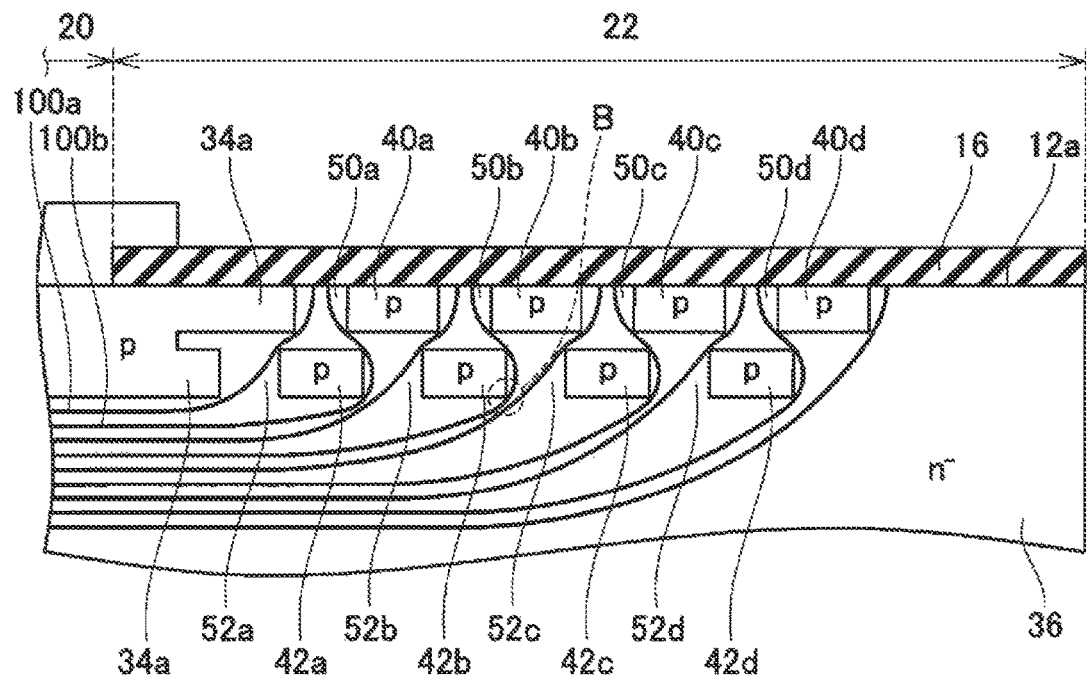
FIG. 4 is an enlarged cross-sectional view of the outer peripheral region.

FIG. 4 illustrates a potential distribution, in other words, each of equipotential lines in the outer peripheral region 22 when the MOSFET is turned off. As shown in FIG. 4, equipotential lines are distributed to pass through the depleted drift region 36 and hardly enter the guard rings. An equipotential line 100a indicates the distribution of the potential higher than the body region 34 and lower than the deep guard ring 42a. The equipotential line 100a extends to the top surface 12a of the semiconductor substrate 12 through the deep spacing region 52a and the surface spacing region 50a. The equipotential line 100a extends diagonally upward to the outer peripheral side as a whole in the outer peripheral region 22. An equipotential line 100b indicates the distribution of the potential higher than the deep guard ring 42a and lower than the surface guard ring 40a. The equipotential line 100b extends diagonally upward to the outer peripheral side and enters the deep spacing region 52b. Since the potential of the equipotential line 100b is lower than the potential of the surface guard ring 40a, the equipotential line 100b cannot enter the outer peripheral side of the surface ring 40a, in other words, the surface spacing region 50b. Therefore, the equipotential line 100b bends inside the deep spacing region 52b, and extends diagonally upward to the inner peripheral side and reaches the top surface 12a of the semiconductor substrate 12 inside the surface spacing region 50a. As described above, in the outer peripheral region 22, the potential is distributed such that the equipotential line 100a and the equipotential line 100b are alternately arranged. The equipotential line 100a is an equipotential line that entirely extends diagonally upward to the outer peripheral side, and the equipotential line 100b is an equipotential line that bends inside the deep spacing region.

Figure 5:
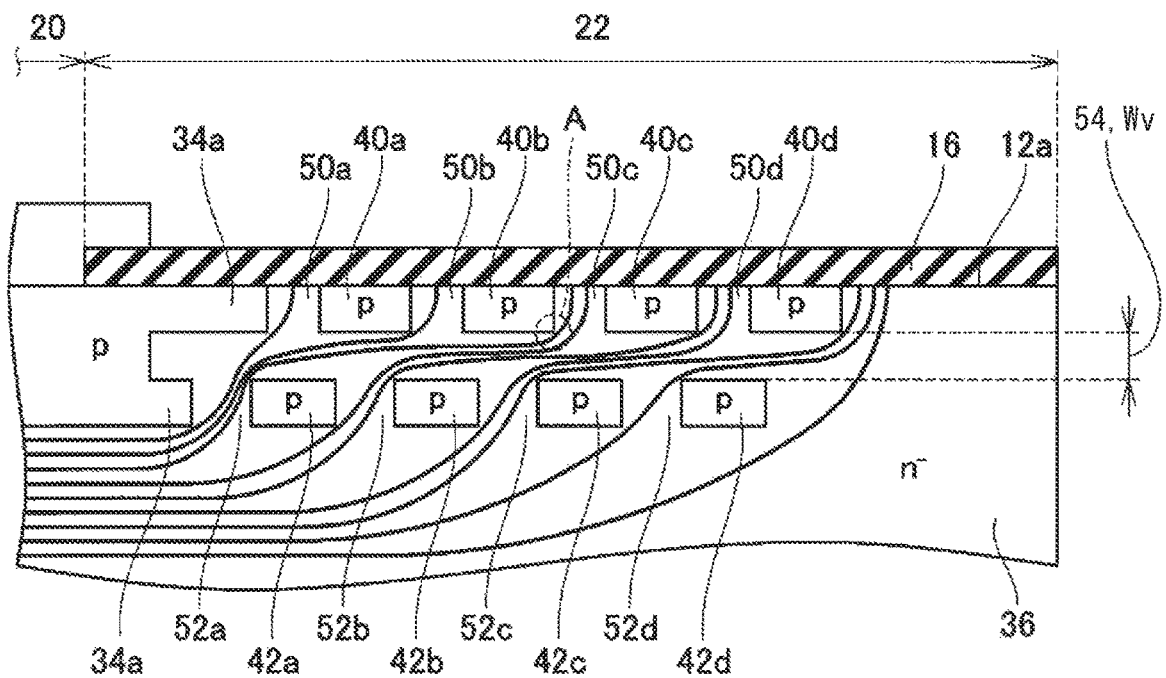
FIG. 5 is an enlarged cross-sectional view of an outer peripheral region of a semiconductor device according to a comparative example.

FIG. 5 illustrates a potential distribution inside the outer peripheral region 22 of a semiconductor device according to a comparative example. In the semiconductor device according to the comparative example, the spacing between the corresponding one of the surface guard rings 40a to 40d and the corresponding one of the deep guard rings 42a to 42d, in other words, the thickness Wv of the intermediate region 54 is relatively large as compared with the semiconductor device according to the first embodiment. The semiconductor device according to the comparative example does not satisfy the mathematical relations (2) and (3). For this reason, in the semiconductor device according to the comparative example, the depletion layer that is extended from the surface protruding portion 34a reaches the surface guard ring 40a before reaching the deep guard ring 42a. In other words, the depletion layer extends to the outer peripheral side through the surface guard rings 40a, 40b, 40c, 40d, and the deep guard rings 42a to 42d do not enhance the extension of the depletion layer at the surface layer portion of the semiconductor substrate 12. Only the deep guard rings 42a to 42d enhance the extension of the depletion layer in the thickness direction of the semiconductor substrate 12. In this case, the potential of the deep guard ring 42a is higher than the potential of the guard ring 40a. Similarly, the potential of the deep guard ring 42b becomes higher than the potential of the surface guard ring 40b, the potential of the deep guard rings 42c becomes higher than the potential of the surface guard ring 40c, and the potential of the deep guard ring 42d becomes higher than the potential of the surface guard ring 40d. In this case, as illustrated in FIG. 5, all of the equipotential lines extend diagonally upward to the outer peripheral side. In the comparative example, there is no equipotential line such as the equipotential line 100b in FIG. 4 that bends inside the corresponding one of the deep spacing regions 52b to 52d and extends upward diagonally to the inner peripheral side. As described above, the potential distribution inside the peripheral region in the first embodiment is different from the one in the comparative example.

As illustrated in FIG. 5, in the semiconductor device according to the comparative example, the equipotential lines are distributed to be relatively dense at the bottom end portions (for example, in region A) of the respective surface guard rings 40a to 40d at the outer peripheral side, so that the electrical field is concentrated at the bottom end portions. When the electrical field is concentrated in the vicinity of the surface guard ring 40a, hot carriers are generated, and the generated hot carriers are easily injected into the oxide film 16. In contrast, as illustrated in FIG. 4, in the semiconductor device according to the first embodiment, the equipotential lines are distributed not to be relatively dense in the vicinity of the surface guard rings 40a to 40d, so that the concentration of the electrical field is suppressed. Therefore, the hot carriers are unlikely to occur in the vicinity of the surface guard rings 40a to 40d. In the semiconductor device according to the first embodiment, the equipotential lines are distributed to be relatively dense at the bottom end portions of the deep guard rings 42a to 42d, for example, inside region B. Therefore, the electrical field is concentrated at this portion. Therefore, the hot carriers are easily generated in the vicinity of the deep guard rings 42a to 42d. However, the deep guard rings 42a to 42d are arranged at positions away from the oxide film 16. Even though the hot carriers are generated in the vicinity of the deep guard rings 42a to 42d, the injection of the hot carriers into the oxide film 16 can be suppressed. According to this semiconductor device, it is possible to suppress the injection of hot carriers into the oxide film. Therefore, it is possible to suppress the unevenness of the electrical field distribution inside the outer peripheral region 22 caused by the hot carriers injected into the oxide film 16. According to the first embodiment, the semiconductor device 10 has a relatively high withstand voltage.

Figure 6A:
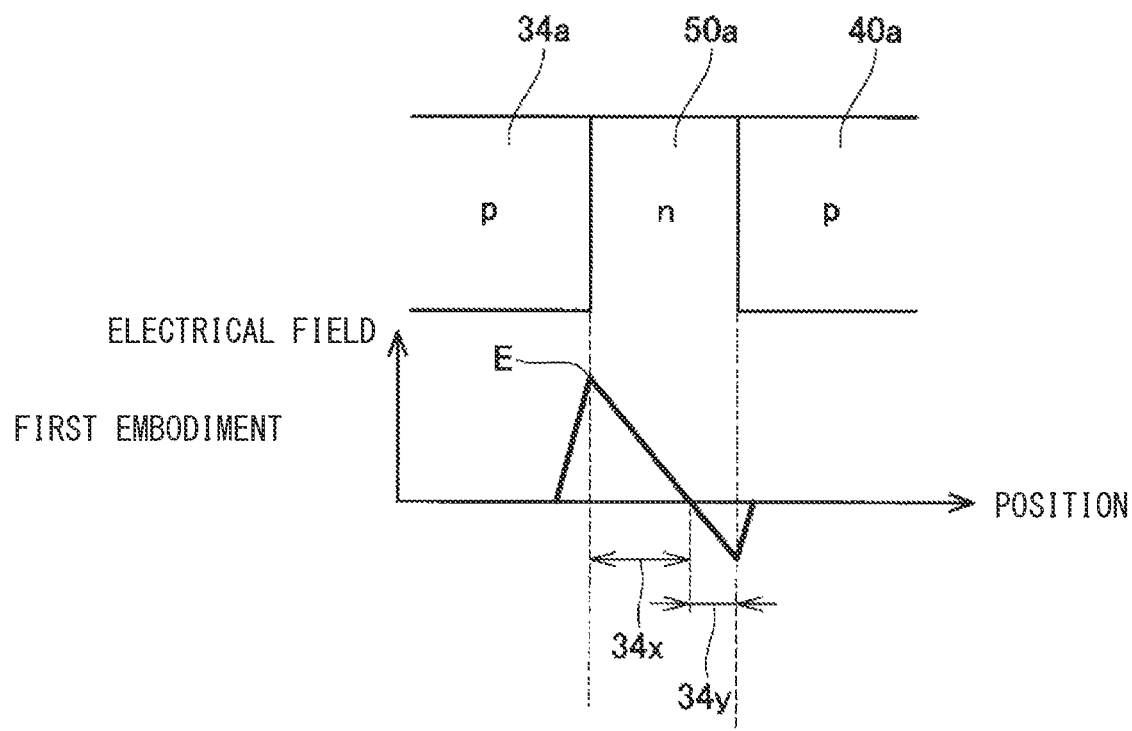
FIG. 6A is a diagram showing an electrical field distribution in a surface spacing region in the first embodiment.
Figure 6B:
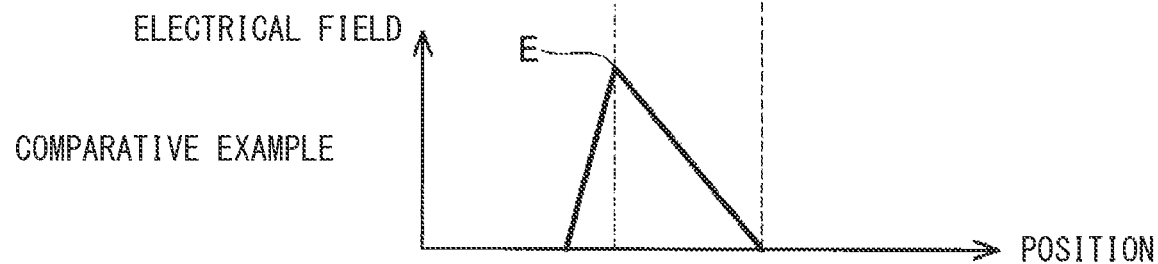
FIG. 6B is a diagram showing an electrical field distribution in a surface spacing region in the comparative example.

FIG. 6A illustrates an electrical field distribution in the surface spacing region 50a in the first embodiment, and FIG. 6B illustrates an electrical field distribution in a surface spacing region in the comparative example. FIG. 6B illustrates that the electrical field in a direction from the outer peripheral side to the inner peripheral side has a positive sign. In the comparative example with reference to FIG. 6B, the entire surface spacing region 50a is depleted by the depletion layer extended from the surface protruding portion 34a. Therefore, the electrical field generated at the entire surface spacing region 50a has a positive sign. In contrast, in the first embodiment with reference to FIG. 6A, the depletion layer that is extended from the deep guard ring 42a reaches the surface guard ring 40a, before the depletion layer that is extended from the surface protruding portion 34a reaches the surface guard ring 40a. A region 34x of the surface spacing region 50a near the surface protruding portion 34a is depleted by the surface protruding portion 34a, and a region 34y of the surface spacing region 50a near the surface guard ring 40a is depleted by the surface guard ring 40a. Therefore, as illustrated in FIG. 6A, the electrical field with the positive sign is generated in the region 34x, and the electrical field with the negative sign is generated in the region 34y. Since the electrical field is generated as described above, the maximum value E of the electrical field generated in the surface spacing region 50a is relatively low in the first embodiment as compared with the comparative example. Similarly, the maximum value E of the electrical field is relatively low in each of the surface spacing regions 50b to 50d. According to the structure in the first embodiment, it is possible to suppress the electrical field generated in the surface spacing region 50a to 50d even though the width of each of the surface spacing regions 50a to 50d is widen. Therefore, the injection of the hot carriers into the oxide film 16 is also suppressed.

As described above, in the first embodiment, the width Wd of each of the deep spacing regions 52a to 52d is larger than the width Ws of each of the surface spacing regions 50a to 50d. As a result, a relatively high electrical field is likely to be generated in each of the deep spacing regions 52a to 52d, as compared with the electrical field generated in each of the surface spacing regions 50a to 50d. Therefore, the hot carriers are likely to be generated in the deep spacing regions 52a to 52d, before the hot carriers are generated in the surface spacing regions 50a to 50d. This further suppresses the generation of the hot carriers in the surface spacing regions 50a to 50d. Therefore, the injection of the hot carriers into the oxide film 16 is also suppressed.

The semiconductor device 10 according to the first embodiment is configured to satisfy the mathematical relation of Wv<Ws. As described above, the width Ws is the width in a horizontal direction, and the width Wv is the width in a vertical direction. The minimum manufacturing value of the width Ws is determined by the manufacturing precision in a manufacturing method of forming the surface guard rings 40a to 40d. The surface guard rings 40a to 40d are formed by ion implantation or selective epitaxial growth. In either method, the width Ws is determined by a mask used in the ion implantation or the selective epitaxial growth. With either method, the width Ws cannot be reduced to a large extent. On the other hand, the minimum manufacturing value of the width Wv is determined by the depth of ion implantation in a case where the surface guard rings 40a to 40d and the deep guard rings 42a to 42d are formed by the ion implantation. The minimum manufacturing value of the width Wv is determined by the thickness of the intermediate region 54 at the time of the epitaxial growth of the intermediate region 54 in a case where the surface guard rings 40a to 40d and the deep guard rings 42a to 42d are formed by the selective epitaxial growth. With either method, it is easier to set the width Wv to be smaller than the width Ws. As described above, it is possible to manufacture the semiconductor device 10 to satisfy the mathematical relations (2) and (3) by setting the width Wv to be shorter than the width Ws.

Second Embodiment

In a second embodiment, the n-type impurity concentration Nd in each of the deep spacing regions 52a to 52d is higher than the n-type impurity concentration Ns in each of the surface spacing regions 50a to 50d. The n-type impurity concentration Nv in the intermediate region 54 may be equal to the n-type impurity concentration Nd, may be equal to the n-type impurity concentration Ns, or may be any other value. Other parts of the semiconductor device according to the second embodiment are identical to the parts in the first embodiment. The semiconductor device according to the second embodiment is configured to satisfy the above mathematical relations (2) and (4) so that the generation of the hot carriers in the surface spacing regions 50a to 50d is suppressed, as similar to the semiconductor device according to the first embodiment. In the semiconductor device according to the second embodiment, since the n-type impurity concentration Nd in each of the deep spacing region 52a to 52d is higher than the n-type impurity concentration Ns in each of the surface spacing regions 50a to 50d, a relatively high electrical field is likely to be generated in the deep spacing regions 52a to 52d. Therefore, the hot carriers are likely to be generated in the deep spacing regions 52a to 52d, before the hot carriers are generated in the surface spacing regions 50a to 50d. This further suppresses the generation of the hot carriers in the surface spacing regions 50a to 50d. Therefore, the injection of the hot carriers into the oxide film 16 is also suppressed. According to the second embodiment, the semiconductor device has a relatively high withstand voltage.

As described above, according to the structure in each of the first and second embodiments, it is possible to enhance the withstand voltage of the semiconductor device. In the structure according to each of the first and second embodiments, it is possible to reduce the on-resistance of the MOSFET while maintaining the withstand voltage by increasing the n-type impurity concentration of the drift region 36.

In each of the first and second embodiments, the MOSFET is formed at the element region 20. However, other semiconductor devices may be formed at the element region 20. For example, an insulated gate bipolar transistor (IGBT), a p-n diode, or a Schottky barrier diode may be formed at the element region 20.

In each of the first and second embodiments, all of the deep spacing regions 52a to 52d are configured to satisfy the above mathematical relation (2). However, one or more of the deep spacing regions 52a to 52d may not be required to satisfy the above mathematical relation (2). In other words, at least one of the deep spacing regions 52a to 52d may satisfy the above mathematical relation (2).

Although the embodiments have been described in detail above, these are merely examples and do not limit the scope of the present description. The techniques described in the claims include various modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A semiconductor device comprising:
   a semiconductor substrate;
   a top electrode in contact with a top surface of the semiconductor substrate;
   a bottom electrode in contact with a bottom surface of the semiconductor substrate; and
   an oxide film in contact with the top surface of the semiconductor substrate,
   wherein the semiconductor substrate includes:
      an element region at which the top electrode is in contact with the top surface of the semiconductor substrate; and
      an outer peripheral region at which the oxide film is in contact with the top surface of the semiconductor substrate,
   wherein the outer peripheral region is located between the element region and an outer peripheral end surface of the semiconductor substrate;
   wherein the element region includes a semiconductor element connected between the top electrode and the bottom electrode,
   wherein the outer peripheral region includes:
      a plurality of surface high-voltage-breakdown regions that respectively have p-type conductivity;
      a plurality of deep high-voltage-breakdown regions that respectively have the p-type conductivity; and
      a drift region that has n-type conductivity,
   wherein each of the surface high-voltage-breakdown regions is in contact with the oxide film,
   wherein the surface high-voltage-breakdown regions are disposed to be spaced from each other along a direction from an inner peripheral side of the semiconductor substrate to an outer peripheral side of the semiconductor substrate, wherein the deep high-voltage-breakdown regions are respectively disposed at positions closer to a bottom surface of the semiconductor substrate than the surface high-voltage-breakdown regions, wherein the deep high-voltage-breakdown regions are disposed to be spaced from each other along the direction from the inner peripheral side to the outer peripheral side, wherein the drift region separates the surface high-voltage-breakdown regions from the deep high-voltage-breakdown regions, separates the surface high-voltage-breakdown regions, and separates the deep high-voltage-breakdown regions, wherein the drift region located at spacing between adjacent two of the surface high-voltage-breakdown regions is defined as a surface spacing region, and the drift region located at spacing between adjacent two of the deep high-voltage-breakdown regions is defined as a deep spacing region, wherein the adjacent two of deep high-voltage-breakdown regions are located right under the surface spacing region, and the deep spacing region is located right under the adjacent two of the surface high-voltage-breakdown regions, wherein each of the deep high-voltage-breakdown regions extends from a first position to a second position, wherein the first position is right under a corresponding one of the surface high-voltage-breakdown regions that is adjacent to the each of the deep high-voltage-breakdown regions and closer to the inner peripheral side than the each of the deep high-voltage-breakdown regions, wherein the second position is right under another corresponding one of the surface high-voltage-breakdown regions that is adjacent to the each of the deep high-voltage-breakdown regions and closer to the outer peripheral side than the each of the deep high-voltage-breakdown regions, wherein one of the deep high-voltage-breakdown regions is defined as a specific deep high-voltage-breakdown region, wherein one of the surface high-voltage-breakdown regions that is adjacent to the specific deep high-voltage-breakdown region and closer to the inner peripheral side than the specific deep high-voltage-breakdown region is defined as an inner peripheral surface high-voltage-breakdown region, wherein another one of the surface high-voltage-breakdown regions that is adjacent to the specific deep high-voltage-breakdown region and closer to the outer peripheral side than the specific deep high-voltage-breakdown region is defined as an outer peripheral surface high-voltage-breakdown region, and wherein the semiconductor substrate is configured to satisfy a mathematical relation of $Nv \times (Wv1+Wv2)^2 < Ns \times Ws^2$, where Ws is in a unit of meters and denotes a width of spacing between the inner peripheral surface high-voltage-breakdown region and the outer peripheral surface high-voltage-breakdown region, Ns is in a unit of inverse cubic meters and denotes n-type impurity concentration of the surface spacing region between the inner peripheral surface high-voltage-breakdown region and the outer peripheral surface high-voltage-breakdown region, Nv is in the unit of inverse cubic meters and denotes n-type impurity concentration of the drift region located in a depth region between each of the surface high-voltage-breakdown regions and corresponding one of the deep high-voltage-breakdown regions, Wv1 is in the unit of meters and denotes a width of spacing between the inner peripheral surface high-voltage-breakdown region and the specific deep high-voltage-breakdown region, and Wv2 is in the unit of meters and denotes a width of spacing between the outer peripheral surface high-voltage-breakdown region and the specific deep high-voltage-breakdown region.

2. The semiconductor device according to claim 1, wherein the semiconductor substrate is further configured to satisfy a mathematical relation of $Wv1 < Ws$ and a mathematical relation of $Wv2 < Ws$.

3. The semiconductor device according to claim 1, wherein n-type impurity concentration of the deep spacing region is higher than n-type impurity concentration of the surface spacing region.

4. The semiconductor device according to claim 1, wherein the semiconductor substrate is further configured to satisfy a mathematical relation of $Nd \times Wd^2 > Ns \times Ws^2$, where Wd is in the unit of meters and denotes a width of the spacing between the adjacent two of the deep high-voltage-breakdown regions, and Nd is in the unit of inverse cubic meters and denotes n-type impurity concentration of the deep spacing region.

* * * * *